United States Patent [19]

Yamazaki et al.

[11] Patent Number: 5,763,899
[45] Date of Patent: Jun. 9, 1998

[54] ACTIVE MATRIX DISPLAY DEVICE

[75] Inventors: Shunpei Yamazaki, Tokyo; Jun Koyama, Sagamihara; Yasuhiko Takemura, Atsugi, all of Japan

[73] Assignee: Semiconductor Energy Laboratory Co., Japan

[21] Appl. No.: 597,835

[22] Filed: Feb. 7, 1996

[30] Foreign Application Priority Data

Feb. 15, 1995 [JP] Japan ................................. 7-050526
May 30, 1995 [JP] Japan ................................. 7-155274

[51] Int. Cl.$^6$ .............................. H01L 29/04; H01L 27/01
[52] U.S. Cl. .......................... 257/59; 257/57; 257/347; 359/54; 359/57; 359/58; 359/59; 359/87
[58] Field of Search ........................ 257/57, 59, 347; 359/54, 57, 58, 59, 87

[56] References Cited

U.S. PATENT DOCUMENTS

| | | | |
|---|---|---|---|
| 5,132,820 | 7/1992 | Someya et al. | 359/59 |
| 5,399,889 | 3/1995 | Miyake et al. | 257/350 |
| 5,515,187 | 5/1996 | Nakamura et al. | 359/59 |
| 5,528,396 | 6/1996 | Someya et al. | 359/59 |
| 5,535,028 | 7/1996 | Bae et al. | 359/61 |

FOREIGN PATENT DOCUMENTS

| | | |
|---|---|---|
| 5-44195 | 7/1993 | Japan . |
| 5-44196 | 7/1993 | Japan . |
| 5-267667 | 10/1993 | Japan . |
| 6-244104 | 9/1994 | Japan . |

*Primary Examiner*—Valencia Martin Wallace
*Attorney, Agent, or Firm*—Edward D. Manzo; Mark J. Murphy

[57] ABSTRACT

In an active matrix display device, a circuit including at least five thin film transistors (TFTs) which are provided with an approximately M-shaped semiconductor region for a single pixel electrode and a gate line and a capacitances line which cross the M-shaped semiconductor region, is used as a switching element. Then, by supplying a selection signal to the gate line, the TFTs are operated, thereby writing data to the pixel, while if a suitable voltage is supplied to the capacitance line, a channel is formed thereunder and it becomes a capacitor. Thus the amount of discharge from the pixel electrode is reduced by this capacitor.

5 Claims, 6 Drawing Sheets

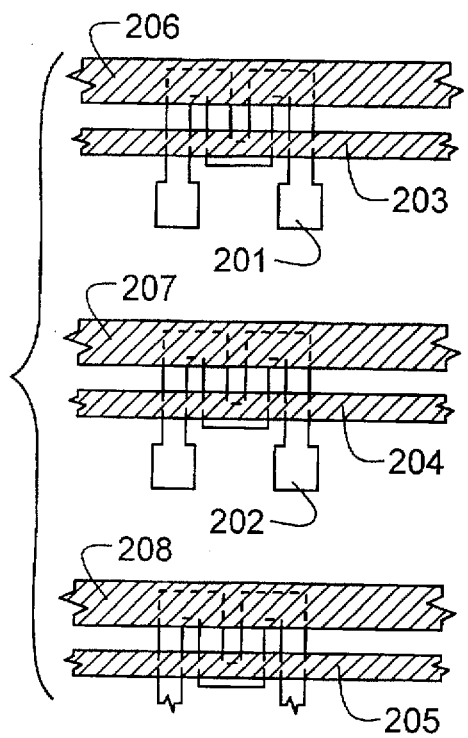
FIG. 4A
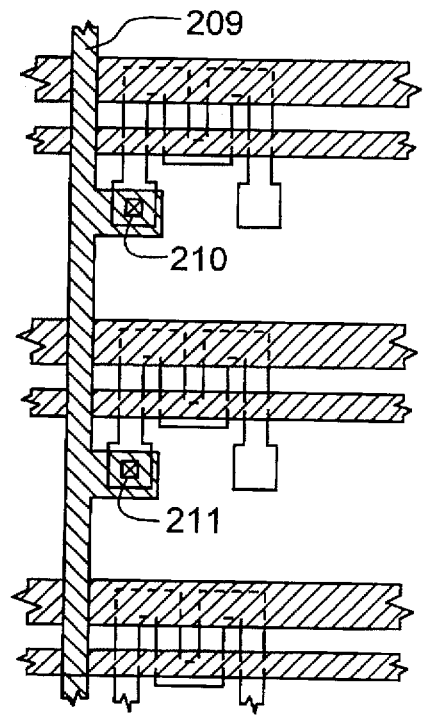
FIG. 4B
FIG. 4C
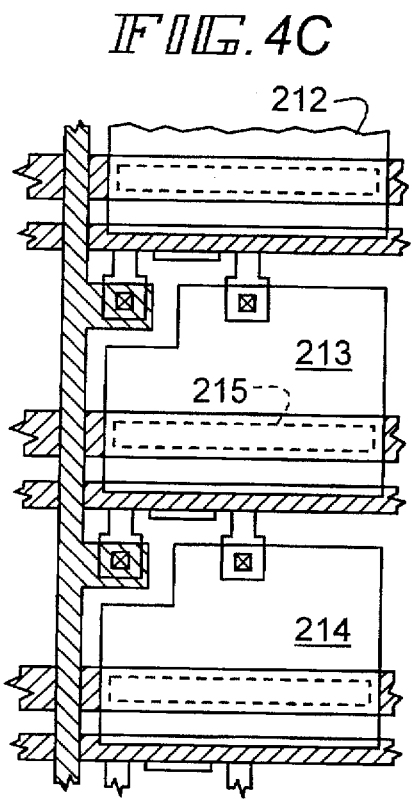
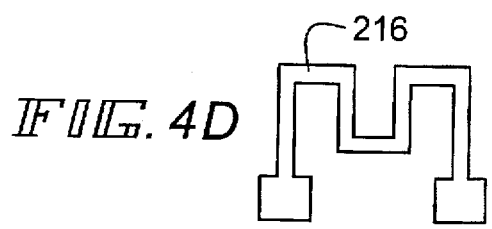
FIG. 4D
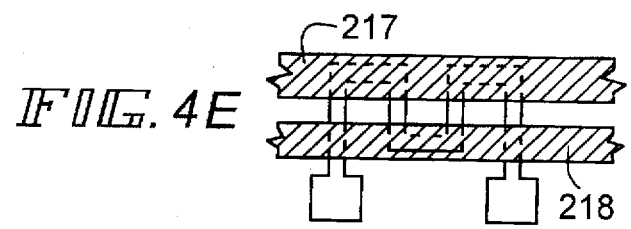
FIG. 4E
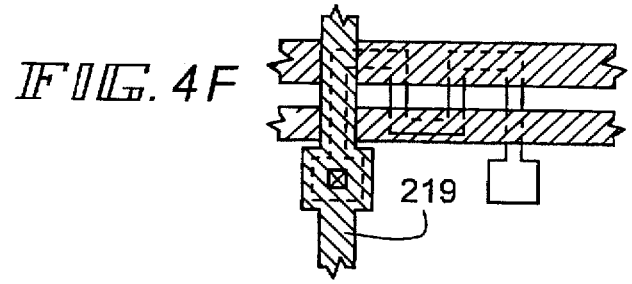
FIG. 4F 5,763,899

1

ACTIVE MATRIX DISPLAY DEVICE

BACKGROUND OF THE INVENTION

1. Field of the Invention

The present invention relates to circuits and elements for improving the image quality of the display screen of an active matrix type display device used in, for example, a liquid crystal display device, a plasma display device or an EL (electroluminescence) display device.

2. Description of the Related Art

FIG. 2A schematically shows a conventional active matrix display device. A region 104 shown by the broken line is a display region. Thin film transistors (TFTs) 101 are arranged at a matrix form in the region 104. The wiring connected to the source electrode of the TFT 101 is an image (data) signal line 106, and the wiring connected to the gate electrode of the TFT 101 is a gate (selection) signal line 105. A plurality of gate signal lines and image signal lines are arranged approximately perpendicular to each other.

In the drive elements, the TFT 101 performs data switching and drives a pixel cell 103. An auxiliary capacitor 102 is used to support the capacity of the pixel cell 103 and store the image data. The TFT 101 is used to switch the image data corresponding to the voltage applied to the pixel cell 103.

In general in a TFT, if a reverse bias voltage is applied to the gate, a phenomenon is known that a current does not flow between the source and the drain (the OFF state), but a leak current (the OFF current) flows. This leak current varies the voltage of the pixel cell.

In an N-channel type TFT, when the gate is negatively biased, a PN junction is formed between a P-type layer which produces at the surface of the semiconductor thin film and an N-type layer of the source region and the drain region. However, since there are a large number of traps present within the semiconductor film, this PN junction is imperfect and a junction leak current is liable to flow. The fact that the OFF current increases as the gate electrode is negatively biased is because the carrier density in the P-type layer formed in the surface of the semiconductor film increases and the width of the energy barrier at the PN junction becomes narrower, thereby leading to a concentration of the electric field and an increase in the junction leak current.

The OFF current generated in this way depends greatly on the source/drain voltage. For example, it is known that the OFF current increases rapidly as the voltage applied between the source and the drain of the TFT increases. That is, for a case wherein a voltage of 5 V is applied between the source and the drain, and one wherein a voltage of 10 V is applied therebetween, the OFF current in the latter is not twice that of the former, but can be 10 times or even 100 times as large. This nonlinearity also depends on the gate voltage. In general, if the reverse bias value of the gate electrode is large (a large negative voltage for an N-channel type), there is a significant difference between both cases.

To overcome this problem, a method (a multigate method) for connecting TFTs in series have been proposed, as described in Japanese Patent Kokoku (examined) Nos. 5-44195 and 5-44196. This aims to reduce the OFF current of each TFT by reducing the voltage applied to the source/drain of each TFT. When two TFTs are connected in series as shown in FIG. 2B, the voltage applied to the source/drain of each TFT is halved. According to the above, if the voltage applied to the source/drain is halved, the OFF current is reduced to 1/10 or even 1/100.

2

However, as the properties required for the image display of a liquid crystal display device become more severe, it becomes difficult to reduce the OFF current sufficiently even using the above multigate method. This is because, even if the number of gate electrodes (the number of TFTs) is increased to 3, 4 or 5, the voltage applied to the source/drain of each TFT is only slightly reduced, to 1/3, 1/4 or 1/5. There are additional problems in that the circuit becomes complicated and the occupied area is large.

SUMMARY OF THE INVENTION

The object of the present invention is to provide a pixel circuit having a construction wherein the OFF current is reduced by decreasing the voltages applied to the source/drain of TFTs connected to the pixel electrode to less than 1/10, preferably less than 1/100 of their normal value. The feature at this time is that the TFTs used for the above purpose are arranged efficiently. In the present invention, five TFTs are used to achieve the above aim. The number of TFTs is not limited in the present invention.

The present invention disclosed in the specification is characterized in that a structure includes gate signal line and image signal lines arranged at a matrix form, pixel electrodes arranged in regions surrounded by the gate signal lines and the image signal lines, and thin film transistors (TFTs) (the number of TFTs is n) having the same conductivity type connected to each other in serial adjacent to each of the pixel electrodes, wherein a source region or a drain region of a first TFT (n=1) is connected to one of the image signal lines, a source region or a drain region of an nth TFT is connected to one of the pixel electrodes, gate electrodes of TFTs (the number of TFTs is n–m (n>m)) are connected to one of the gate signal lines in common, and a gate voltage in TFTs (the number of TFTs is m) is maintained to a voltage that a channel forming region becomes the same conductivity type as that of the source region and the drain region An example of the above structure is shown in FIG. 2C. In FIG. 2C, five TFTs 121 to 125 are arranged, that is, n=5 and m=2. The source region of the TFT 121 (n=1) is connected to an image signal line 129. The drain region of an nth TFT (n=5) is connected to one of electrodes (pixel electrode) of a pixel cell 127. The gate electrodes of the TFTs 121 to 123 (the number of TFTs is n–m (n>m)) are connected to a common gate signal line 128. The gate electrodes of the TFTs 124 and 125 (the number of TFTs is m) are connected to a common capacitance line 130 which is maintained at a desired voltage.

In FIG. 2C, the basic feature of the present invention is to connect the TFTs 121, 122, 123, 124 and 125 in series, of these, to connect the gates of the TFTs 121 to 123 to the gate signal line 128, and to connect the gates of the other TFTs 124 and 125 to the capacitance line 130. Thus, when the voltage of the pixel is maintained, capacitors are formed between the channel and the gate electrode of the TFTs 124 and 125 by maintaining the capacitance line at a suitable voltage.

Thus the voltage produced between the source and the drain of the TFTs 122 and 123 is reduced, so that it is possible to reduce the OFF current of these TFTs. An auxiliary capacitor 126 as shown in the figure is not absolutely necessary. Rather, since it increases the load during data writing, there are cases in which it is preferably not included, if the ratio between the capacitance of the pixel cell and the capacitance generated in the TFTs 124 and 125 is optimum.

To describe the action specifically: when a selection signal is applied to the gate signal line 128, all the TFTs 121 to 123 are turned on. In order for the TFTs 124 and 125 also to be ON, it is necessary to apply a signal to the capacitance line. Thus, the pixel cell 127 is charged in accordance with a signal on the image signal line 129, and at the same time the TFTs 124 and 125 are also charged. At the (equilibrium) stage when sufficient charging has performed, the voltages between the source and the drain of the TFTs 122 and 123 are approximately the same.

If, in this state, the selection signal is not applied or disconnected, then all of the TFTs 121 to 123 are turned off. At this stage, the TFTs 124 and 125 are still in an ON state. An another pixel signal is subsequently applied to the image signal line 129, and since the TFT 121 has a finite OFF current, the charge stored in the TFT 124 is discharged, so that the voltage reduces. However, the speed thereof is approximately the same as the speed at which the voltage drops in the capacitor 102 in the normal active matrix circuit of FIG. 2A.

In the TFT 122, since the voltage between the source and the drain is initially approximately zero, the OFF current is extremely small, but subsequently the voltage of the TFT 124 reduces, and thus the voltage between the source and the drain of the TFT 122 gradually increases, and consequently the OFF current also increases. Also, in the TFT 123, the OFF current also increases gradually in the same way, but the rate thereof is also even smaller than that of the TFT 122. From the above, the voltage drop of the pixel cell 127 due to the increase in the OFF current of the TFTs is much slower than with the normal active matrix circuit of FIG. 2A.

It should be noted that further, if LDD (lightly doped drain) regions or offset regions are formed in the channels of the TFTs 121 to 125, then these regions become a drain resistor and a source resistor, and it is therefore possible to weaken the electric field strength at the drain junction, and to reduce the OFF current.

The integration of such a circuit can be increased by a circuit arrangement, in FIG. 1A, such that the gate signal line 128 and the capacitance line 130 are overlaid on an approximately M-shaped semiconductor region 100. FIG. 1B to 1D show possible combination arrangements at this time, and the same effects are obtained whichever of these is employed.

FIG. 1B is the most orthodox form. TFTs 121 to 125 are formed at the intersections of the semiconductor region 100 with the gate signal line 128 and the capacitance line 130 (three intersections with the gate signal line and two intersections with the capacitor line: a total of five intersections). If an N-type or P-type impurity is introduced into the regions (four regions in FIG. 1A) of the semiconductor region separated (enclosed) by the gate signal lines and the capacitance lines, and the regions at both ends of the semiconductor region, then these become the source and the drain of the TFT. The image signal line and the pixel electrode should be formed such that they are connected to either of the ends of the semiconductor region. (FIG. 1B)

It is also possible, in FIG. 1C, for the points a and b not to be covered by the capacitance line. This is because it is sufficient for the TFTs 124 and 125 only to function as capacitors.

In FIG. 1D, it is possible to construct TFTs 131 to 136 by forming six intersections with the semiconductor region 100. The circuit is shown in FIG. 2D, and the TFT 122 in FIG. 2C is simply replaced with two serial TFTs. It is thus possible to reduce the OFF current in comparison with that in FIG. 2C.

BRIEF DESCRIPTION OF THE DRAWINGS

FIGS. 4A to 4F show the producing process (upper view) of the switching elements in an embodiment;

DETAILED DESCRIPTION OF THE PREFERRED EMBODIMENTS

[Embodiment 1]

The embodiment increase the understanding of the present invention by describing the producing processes of the circuit. FIGS. 1A to 1D show the circuit of the embodiment when viewed from above, and FIGS. 3A to 3D are a cross sectional view of the producing process. In FIGS. 3A to 3D, the left side shows a cross section through the portion indicated by the dot-dash line X-Y in FIG. 1A, and the right side shows a cross section of the portion indicated by X'-Y'. Also, they are drawn adjacent, but it should be noted that clearly X-Y and X'-Y' are not on the same straight line.

In the embodiment, the feature is that an offset gate is constructed by anodizing the gate electrode, to further reduce the OFF current. It should be noted that a technique for anodizing the gate electrode is disclosed in Japanese Patent Open No. 5-267667. A gate electrode with a construction such as is normally used may also be used in the present invention.

A silicon oxide film 152 having a thickness of 1000 to 5000 Å, for example, 3000 Å, is formed as a base film on a substrate (Corning 7059, 100 mm×100 mm) 151. A TEOS (tetraethoxysilane) is decomposed and deposited by plasma CVD (chemical vapor deposition) to form the silicon oxide film. This process may also be performed by sputtering.

An amorphous silicon film having a thickness of 300 to 1500 Å, for example 500 Å, is deposited by plasma CVD or the low pressure CVD (LPCVD) and then left for 8 to 24 hours in an atmosphere at 550° to 600° C. and is crystallized. At this time the crystallization may be promoted by adding a small amount of nickel. A technique for promoting crystallization by adding nickel or the like, to reduce the crystallization temperature and shorten the crystallization time is provided in Japanese Patent Open No. 6-244104.

This process may also be performed by photo-annealing with laser irradiation or the like. It may be performed by a combination of thermal annealing and photo-annealing.

Figure 1A:
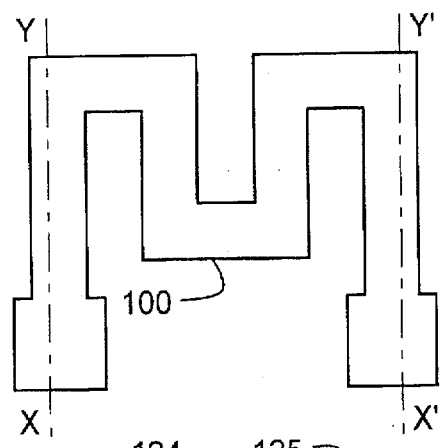
FIGS. 1A to 1D show the arrangement of the semiconductor region, the gate signal line and the capacitance line in the present invention.
Figure 3A:
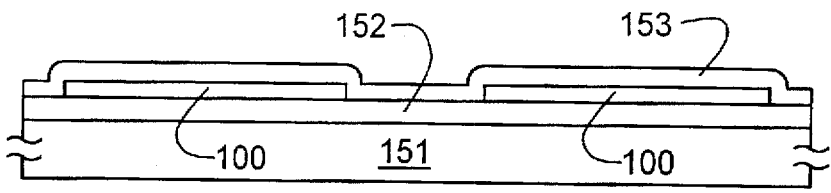
FIGS. 3A to 3F show the producing process (cross section view) of the switching elements in an embodiment.

The crystallized silicon film is etched to form an approximately M-shaped island-shaped region 100. A gate insulating film 153 is formed thereon. That is, a silicon oxide film with a thickness of 700 to 1500 Å, for example 1200 Å, is formed by plasma CVD. This process may also be performed by sputtering. (FIGS. 1A and 3A)

Figure 1B:
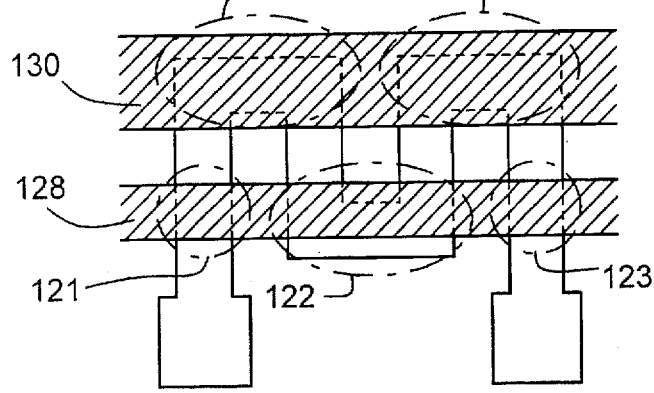
Figure 1C:
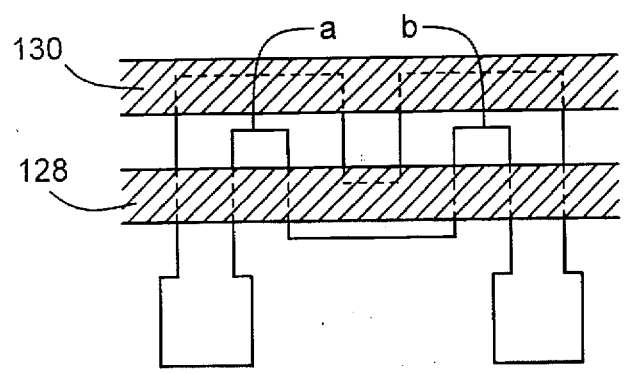
Figure 1D:
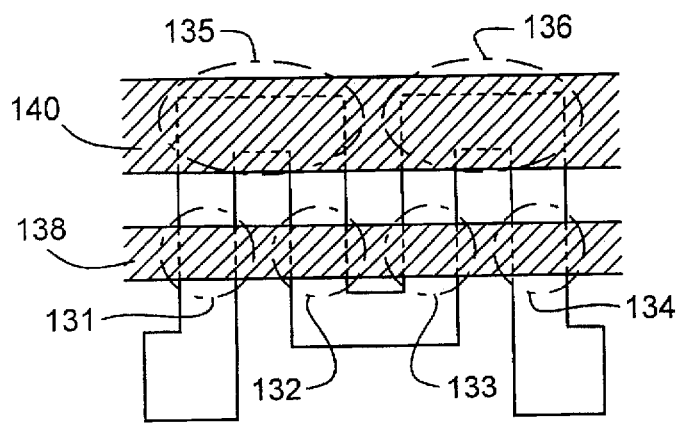
Figure 3B:
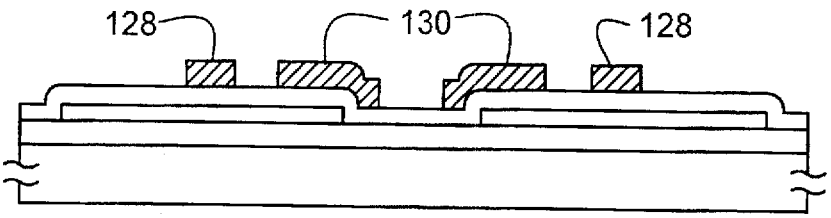

An aluminum (containing 1 weight % Si, or 0.1 to 0.3 weight % Sc) film is formed to a thickness of 1000 Å to 3 µm, for example 5000 Å, by sputtering, and then etched to form the gate signal line 128 and the capacitance line 130. These are both gate electrodes of thin film transistors (TFTs). (FIGS. 1B and 3B)

Figure 8:
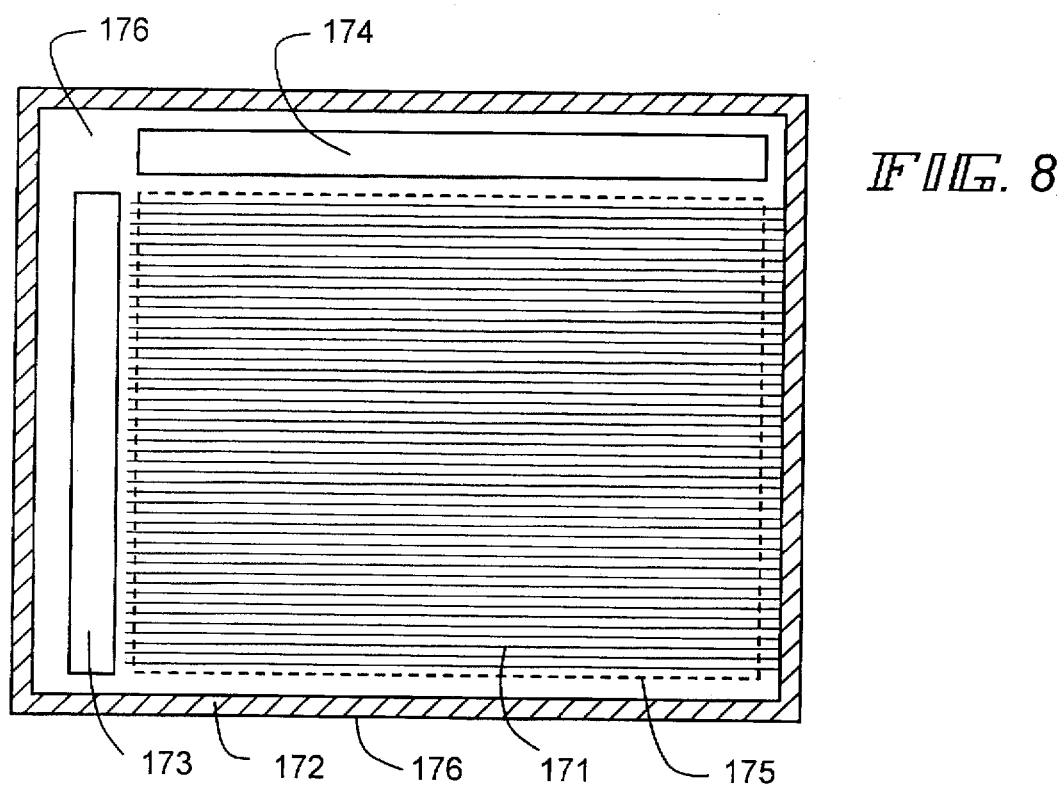
FIG. 8 shows the arrangement of the gate signal line and the capacitance line, etc., and the peripheral circuit in an embodiment.

At this stage, in FIG. 8, all of the other gate signal lines and capacitance lines (aluminum wiring 171) on the substrate 176 are connected to an aluminum film region 172 formed at the periphery of an active matrix region 175. However, if the aluminum wirings of the gate electrodes or the like of the peripheral circuit (the gate driver 173 and the source driver 174) are designed to insulate them from the aluminum region 172 at this time, anodization does not occur in the peripheral circuit and is possible to improve the integration. (FIG. 8)

Figure 3C:
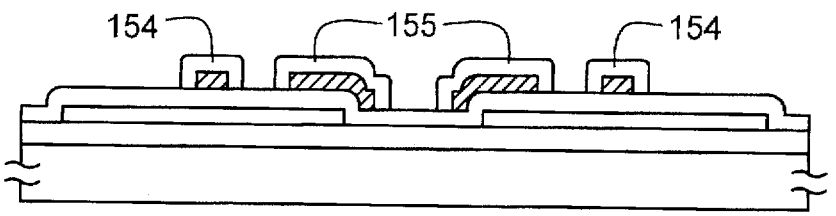

A current is passed through the gate electrodes in an electrolytic solution to perform anodization, so that an anodic oxide with a thickness of 500 to 2500 Å, for example 2000 Å is formed. The electrolytic solution is obtained by diluting L-tartaric acid with ethylene glycol to a concentration of 5% and adjusting to a pH of 7.0±0.2 using ammonia. The substrate is immersed into the solution. The positive side of a constant current source is connected to the gate electrodes on the substrate and the negative side is connected to a platinum electrode. A voltage is applied with a constant current of 20 mA, and oxidation is continued until the voltage reaches 150 V. Oxidation is further continued with a constant voltage of 150 V until the current decreases below 0.1 mA. Thus, aluminum oxide films 154 and 155 with a thickness of 2000 Å is obtained on the gate signal line 128 and the capacitance line 130. (FIG. 3C)

Figure 3D:
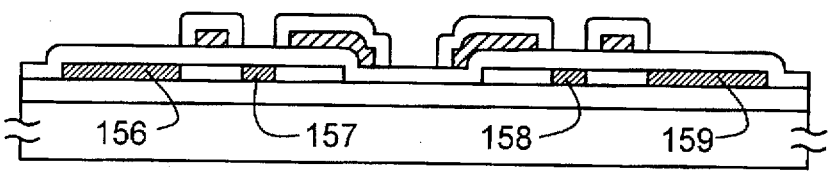

An impurity (phosphorus in this case) is then implanted into the island-shaped region 100 in a self-alignment by ion doping with the gate electrode portions (the gate electrodes and the anodic oxide film at the periphery thereof) as a mask, to form N-type impurity regions. The doping gas is phosphine ($PH_3$). The dose is $1 \times 10^{14}$ and $5 \times 10^{15}$ atoms/cm$^2$, and the acceleration voltage is 60 to 90 kV, for example, a dose is $1 \times 10^{15}$ atoms/cm$^2$ and an acceleration voltage is 80 kV. Thus, N-type impurity regions 156 to 159 are formed. (FIG. 3D)

A KrF excimer laser (a wavelength of 248 nm, pulse width of 20 ns) is irradiated to activate the doped impurity regions 156 to 159. A suitable value for the energy density of the laser is 200 to 400 mJ/cm$^2$, preferably 250 to 300 mJ/cm$^2$. This process may also be performed by thermal annealing. In particular, activation can be performed by thermal annealing at a temperature lower than in the normal case, by including a catalyst element (nickel) (Japanese Patent Open No. 6-267989).

The N-type impurity regions are formed in this way, but in the embodiment the impurity regions are separated from the gate electrodes by the thickness of the anodic oxide, and it can thus be seen that they are so-called offset gates. It can be seen that the TFTs 121, 123, 124 and 125 have been formed. The other TFT 122 is also formed in the same way.

Figure 3E:
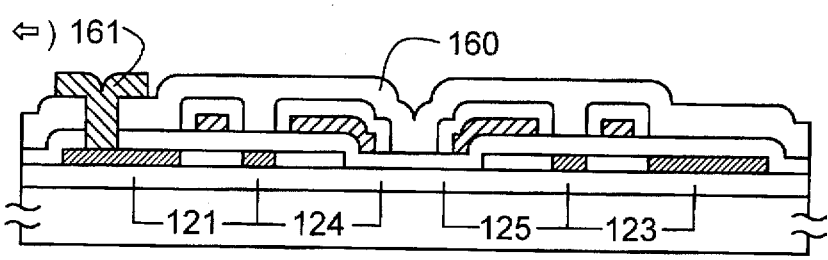

A silicon oxide film 160 is then formed to a thickness of 5000 Å as an interlayer insulating film by plasma CVD. At this time TEOS and oxygen are used as the raw gas. The interlayer insulating film 160 and the gate insulating film 153 are then etched to form a contact hole in the N-type impurity region 156. An aluminum film is then formed by sputtering and etched to form the source electrode/wiring 161. This is an extension of the image signal line 129. (FIG. 3E)

A passivation film 162 is then formed. A silicon nitride film is formed to a thickness of 2000 to 8000 Å, for example 4000 Å, as the passivation film, by plasma CVD using an $NH_3/SiH_4/H_2$ mixture gas. The passivation film 162, the interlayer insulating film 160 and the gate insulating film 153 are then etched to form a contact hole for the pixel electrode in the N-type impurity region 159.

Figure 2A:
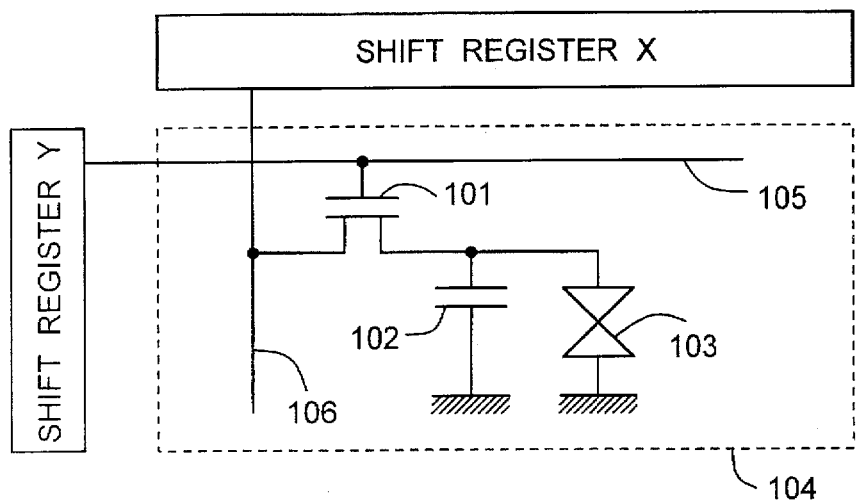
FIGS. 2A to 2D show the outline of the active matrix circuits.
Figure 2B:
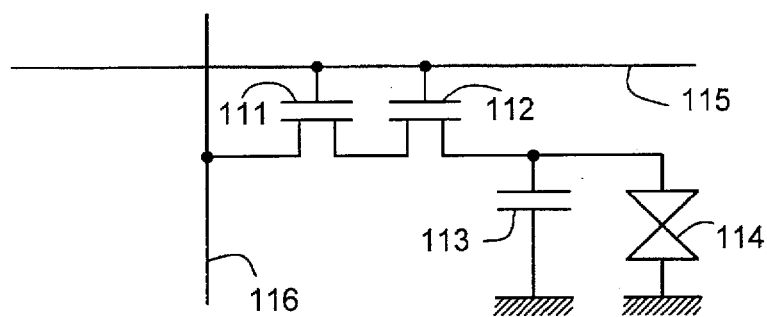
Figure 2C:
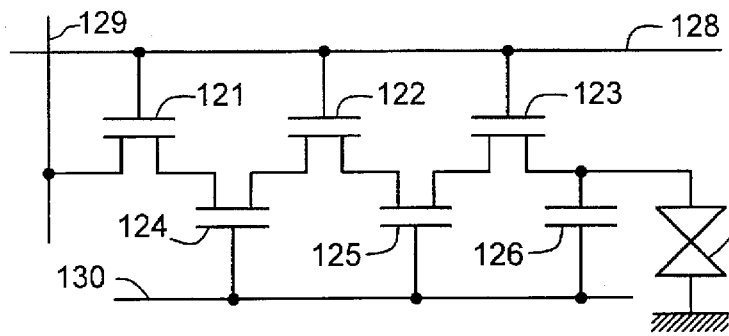
Figure 2D:
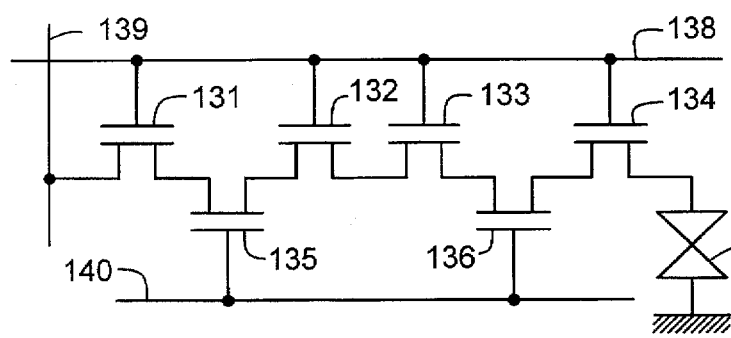
Figure 3F:
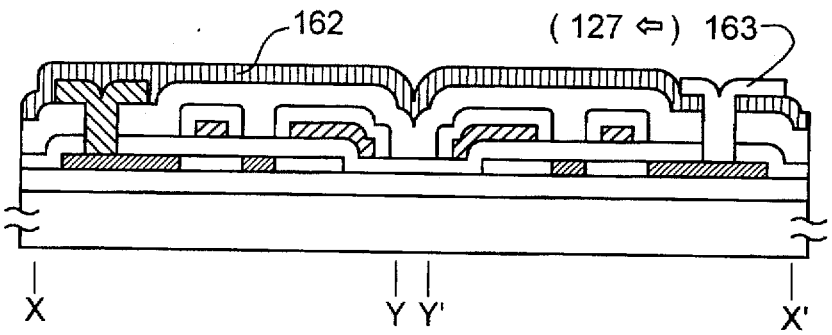

An indium tin oxide (ITO) film is formed by sputtering and then etched to form a pixel electrode 163. The pixel electrode is one electrode of a pixel cell 127. By the above process, an active matrix circuit element having N-channel type TFTs 121 to 125 is formed. The switching element circuit of the embodiment is as shown in FIG. 2C without the auxiliary capacitor 126. (FIG. 3F)

[Embodiment 2]

FIGS. 4A to 4F show the process for forming the circuit in the embodiment. A detailed description of the specific processes is not given since a known technique (or the technique in embodiment 1) should be used.

Approximately M-shaped semiconductor regions (active layers) 201 and 202 are formed as in Embodiment 1 (or FIG. 1A). After a gate insulating layer (not shown) is formed, gate signal lines 203 to 205 and capacitance lines 206 to 208 are formed. The positional relationship between the gate signal lines, the capacitance lines and the active layer are the same as in Embodiment 1. (FIG. 4A)

Then, after doping the active layer, an interlayer insulator is formed, and contact holes 210 and 211 are formed at the left ends of the active layers, and an image signal line 209 is formed. (FIG. 4B)

Pixel electrodes 212, 213 and 214 are then formed in a region surrounded by the gate signal lines and the image signal lines. Thus switching elements for an active matrix circuit are formed. In the embodiment, in FIG. 4C, the capacitance line 207 is arranged such that it is not overlapped with the pixel electrode 213 of the corresponding row, but is overlapped with the pixel electrode 212 which is one row higher. Thus, a capacitor 215 corresponding to the auxiliary capacitor 126 of FIG. 2C is formed between the capacitance line 207 and the pixel electrode 212. The same applies to the other rows. (FIG. 4C)

Figure 6:
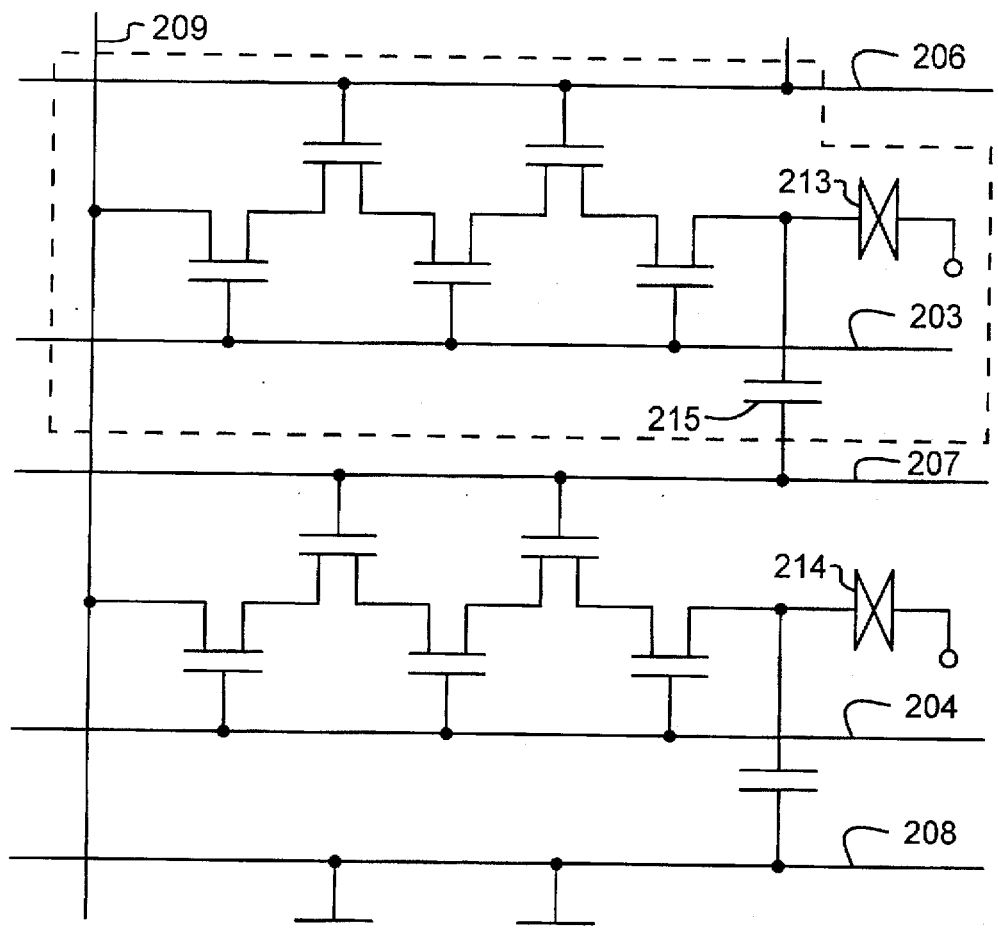
FIG. 6 shows a circuit of the switching elements in an embodiment.

Thus, by an arrangement in which the gate signal lines are overlapped with the pixel electrodes one row higher (or lower) than the corresponding row, a circuit as shown in FIG. 6 is constructed, but the capacitor 215 is formed on the capacitance line, and it is thus possible to add capacitance without effectively reducing the aperture ratio, and this is effective in improving the integration of the circuit.

Figure 5:
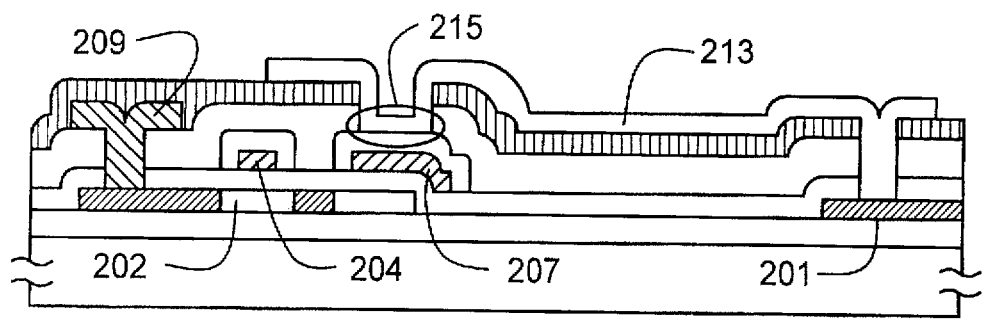
FIG. 5 shows a cross section of the switching elements in an embodiment.

To increase the capacitance of the capacitor 215, the interlayer insulator at the overlapping portion should be etched. Thus, the distance between the electrodes can be reduced and the capacitance can be increased. To this end, it is preferred that the surface of the capacitance line is covered by an anodic oxide, as in Embodiment 1. The anodic oxide is a dielectric. A cross section is shown in FIG. 5.

Performing etching of the corresponding portion in order to obtain the capacitor 215 does not increase the number of processes. That is, when the interlayer insulator is etched to form the contact holes 210 and 211, or the contact hole for the pixel electrode, a hole should also be formed on the capacitor line at the same time. FIG. 5 shows an example of the latter case. Under appropriate etching conditions, the aluminum anodic oxide and the like are not etched at all (for example, dry etching conditions in which silicon oxide is etched), and thus etching can be continued until the contact holes is formed.

Overlapping the semiconductor region 216 and part of the TFTs with the pixel signal line 219, as shown in FIG. 4D to 4F, is effective in improving the aperture ratio.

Figure 7A:
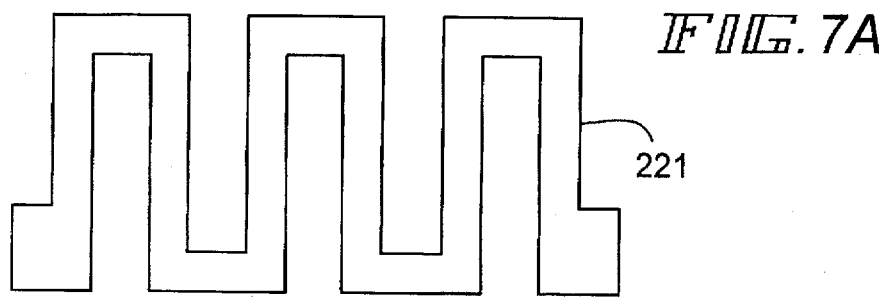
FIGS. 7A and 7B show the arrangement of the semiconductor region, the gate signal line and the capacitance line in an embodiment.
Figure 7B:
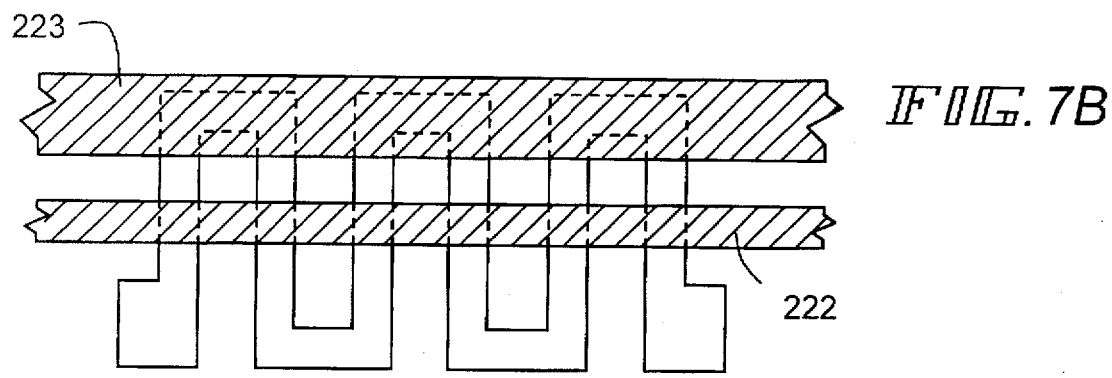

In FIGS. 7A and 7B, it is possible to form a larger number of transistors by increasing the intricacy of bends of the island-shaped semiconductor region 221 (FIG. 7A), and overlaying the gate signal line 222 and the capacitance line 223 on this regions (FIG. 7B). Thus, it is possible to reduce further the OFF current.

In the present invention, it is possible to suppress a drop in the voltage of the liquid crystal cell by connecting the gates of a plurality of TFTs to a gate signal line and a capacitor line in each pixel. In particular, the voltages between the source and the drain of the TFTs 122 and 123 in FIG. 2C are kept low during the entire driving process. In general, deterioration of TFTs depends on the voltage between the source and the drain, and it is thus also possible to prevent deterioration by the present invention.

The present invention is effective in applications which require a high resolution image display. That is, to display 256 or more extremely subtle gradations of light and shade, the discharge of the liquid crystal cell must be suppressed to 1% or less during one frame. With conventional systems, neither of FIG. 2A or 2B are suitable for this objective.

Further, the present invention is suitable for an active matrix display device using crystalline silicon semiconductor TFTs, which is suitable for matrix displays and the like which have a particularly large number of rows (lines). In general, with a matrix having a large number of rows, the selection period per row is short and therefore amorphous silicon semiconductor TFTs are not suitable. However, TFTs using crystalline silicon semiconductors have the problem that the OFF current is large.

Thus the present invention in which the OFF current can be reduced can also make a significant contribution in this field. TFTs using amorphous silicon semiconductors are also advantageous.

The embodiments are described mainly with respect to TFTs having a top gate type structure, but the advantages of the present invention do not vary if bottom gate type or other structure are used.

With the present invention, it is possible to obtain a maximum effect with a minimum change. In particular, with top gate type TFTs, although the form of the thin semiconductor region (active layer) is complicated, the gate electrodes and the like have an extremely simple form, and it is consequently possible to prevent cutting (disconnecting) of the upper layer wirings. Conversely, if the gate electrode has a complicated form then this causes a reduction in the aperture ratio. Thus the present invention is beneficial in industry.

What is claimed is:

1. An active matrix display device comprising:
   image signal lines;
   gate signal lines, the image signal lines and the gate signal line being formed in a matrix;
   a capacitance line parallel to said gate signal lines;
   a pixel electrode; and
   at least three thin film transistors, said pixel electrode and said at least three thin film transistors being connected in series with each other,
   wherein one of said three thin film transistors provided in the center of said three thin film transistors is connected to said capacitance line,
   wherein another one of said three thin film transistors provided at one end of said three thin film transistors is connected to one of said image signal lines and one of said gate signal lines, and
   wherein another of said three thin film transistors provided at another end of said three thin film transistors is connected to said pixel electrode and said one of the gate signal lines.

2. An active matrix display device comprising:
   a plurality of image signal lines;
   a plurality of gate signal lines arranged approximately perpendicular to the image signal lines;
   a plurality of capacitance lines of which one each is arranged parallel to and between the gate signal lines;
   pixel electrodes provided in regions surrounded by the gate signal lines and the image signal lines; and
   switching elements connected to each of the pixel electrodes,
   wherein each of the switching elements comprises one approximately M-shaped semiconductor film comprising at least three portions overlapped with one of the gate signal lines, and at least two portions overlapped with one of the capacitance lines.

3. An active matrix display apparatus comprising:
   a plurality of image signal lines;
   a plurality of gate signal lines arranged approximately perpendicular to the image signal lines;
   a plurality of capacitance lines of which one each is arranged parallel to and between the gate signal lines;
   pixel electrodes provided in regions surrounded by the gate signal lines and image signal lines; and
   switching elements connected to each of the pixel electrodes,
   wherein each of the switching elements comprises one approximately M-shaped semiconductor film comprising a region which is in contact with one of the image signal lines, a region which is in contact with the pixel electrodes, and at least four regions which are divided by the capacitor lines and the gate signal lines, all of the regions having a N-type or P-type conductivity type.

4. An active matrix display device comprising:
   a plurality of image signal lines;
   a plurality of gate signal lines arranged approximately perpendicular to the image signal lines;
   a plurality of capacitance lines of which one each is arranged parallel to and between the gate signal lines;
   pixel electrodes provided in regions surrounded by the gate signal lines and image signal lines; and
   switching elements connected to each of the pixel electrodes,
   wherein each of the switching elements comprises one approximately M-shaped semiconductor film comprising at least three portions overlapped with one of the gate signal lines, and at least two portions overlapped with one of the capacitance lines, and wherein each of the capacitance lines is not overlapped with a pixel of a corresponding row and is overlapped with a pixel of a row adjacent to the corresponding row.

5. An active matrix display apparatus comprising:
   a plurality of image signal lines;
   a plurality of gate signal lines arranged approximately perpendicular to the image signal lines;
   a plurality of capacitance lines of which one each is arranged parallel to and between the gate signal lines;
   pixel electrodes provided in regions surrounded by the gate signal lines and image signal lines; and
   switching elements connected to each of the pixel electrodes,
   wherein each of the switching elements comprises one approximately M-shaped semiconductor film comprising a region which is in contact with one of the image signal lines, a region which is in contact with the pixel electrodes, and at least four regions which are divided by the capacitor lines and the gate signal lines, all of the regions having a N-type or P-type conductivity type, and wherein each of the capacitance lines is not overlapped with a pixel of a corresponding row and is overlapped with a pixel of a row adjacent to the corresponding row.

* * * * *